United States Patent
Dong

Patent Number: 6,030,238
Date of Patent: Feb. 29, 2000

[54] EJECTOR MECHANISM FOR A CARD CONNECTOR HAVING A RETRACTABLE PUSH BUTTON

[75] Inventor: Shun-Chi Dong, Tu-Chen, Taiwan

[73] Assignee: Hon Hai Precision Ind. Co., Ltd., Taipei Hsien, Taiwan

[21] Appl. No.: 09/115,146

[22] Filed: Jul. 14, 1998

[30] Foreign Application Priority Data

Jul. 15, 1997 [TW] Taiwan ................. 86212162

[51] Int. Cl.[7] .................................................. H01R 13/62
[52] U.S. Cl. .......................................................... 439/159
[58] Field of Search ........................ 439/159; 361/798, 361/754

[56] References Cited

U.S. PATENT DOCUMENTS

| | | | |
|---|---|---|---|
| 5,421,737 | 6/1995 | Chen et al. | 439/157 |
| 5,443,395 | 8/1995 | Wang | 439/159 |
| 5,653,603 | 8/1997 | Sassao et al. | 439/159 |
| 5,778,521 | 7/1998 | Law et al. | 291/829 |
| 5,791,920 | 8/1998 | Tomioka et al. | 439/159 |
| 5,795,190 | 8/1998 | Ono | 439/159 |
| 5,800,189 | 9/1998 | Ahmed | 439/159 |
| 5,846,096 | 12/1998 | Ishida | 439/159 |
| 5,871,365 | 2/1999 | Kaijura | 439/159 |
| 5,890,920 | 4/1999 | David et al. | 439/159 |

*Primary Examiner*—Michael L. Gellner
*Assistant Examiner*—Antoine Ngandjui

[57] ABSTRACT

A card connector for engaging an inserted IC card comprises a housing, contacts, an ejector mechanism, and guiding and retracting means. The guiding and retracting means is disposed between a push button and a push arm of the ejector mechanism and includes a continuous jagged guiding channel defined on a surface of an engaging socket, a guiding core, and a spring. The guiding channel forms first and second positioning portions which provide the push button with retraction and extension capabilities so that when the push button is depressed the guiding core will slide along the guiding channel. The push button is rotatably positioned in one of the two positioning portions of the channel thereby controlling the retraction/extension of the push button into/out of an enclosure of the computer.

12 Claims, 7 Drawing Sheets

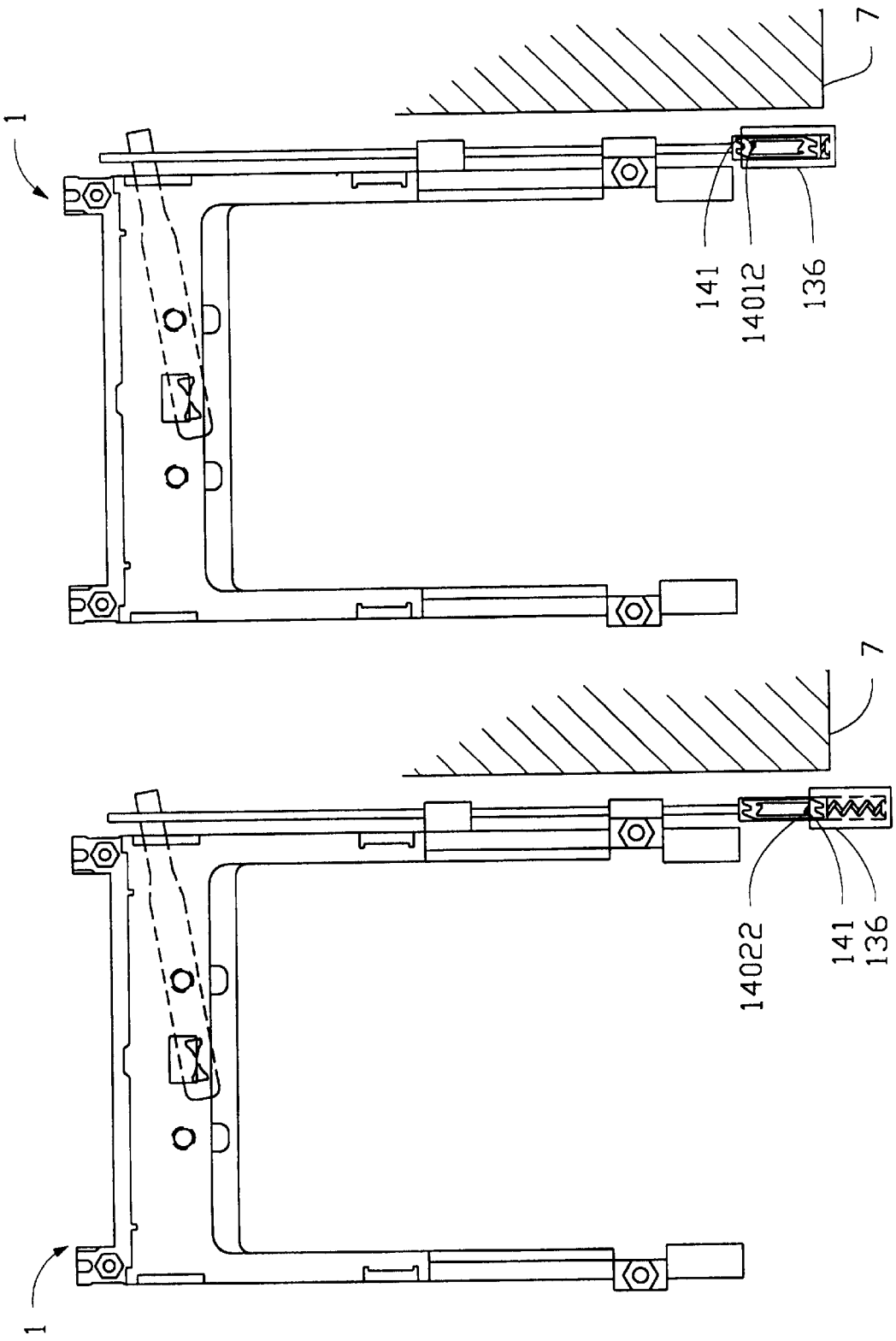

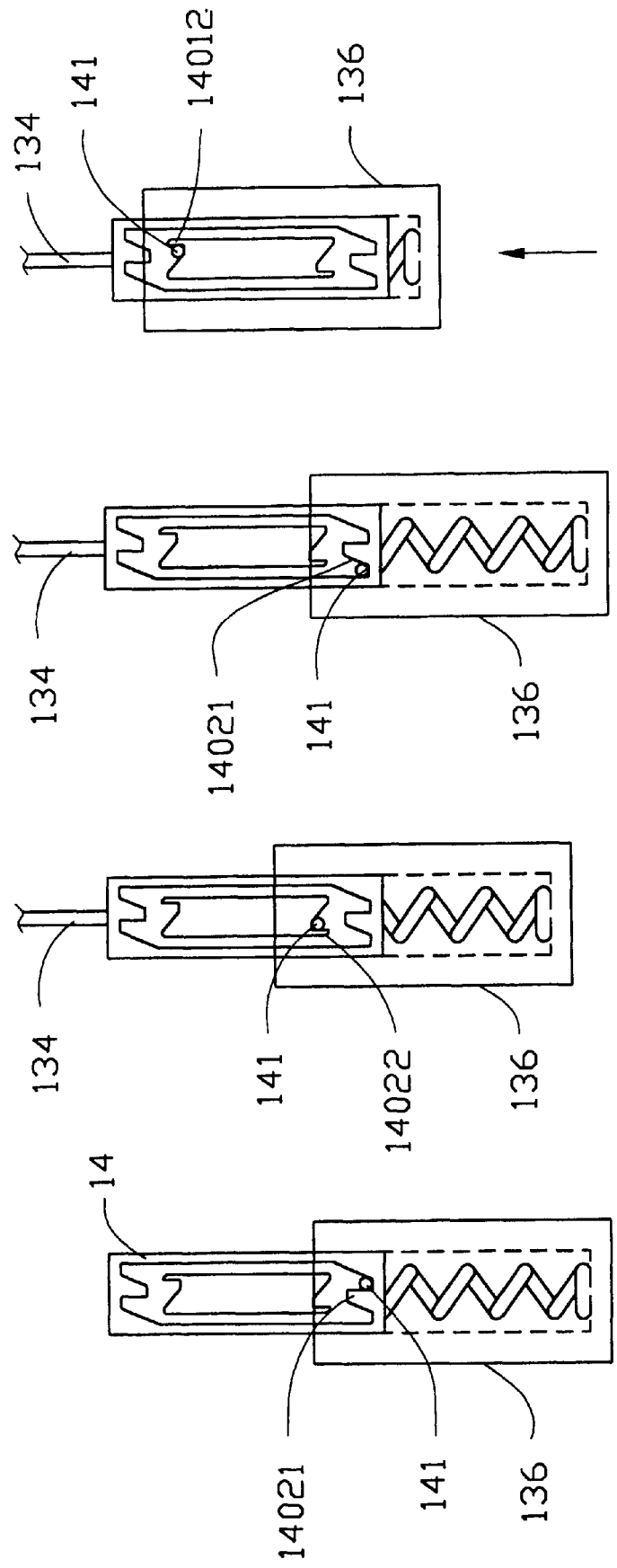

EJECTOR MECHANISM FOR A CARD CONNECTOR HAVING A RETRACTABLE PUSH BUTTON

BACKGROUND OF THE INVENTION

1. Field of the Invention

The present invention relates to a card connector, and particularly to a ejector mechanism for a card connector having a retractable push button.

2. The Prior Art

Portable or laptop computers are provided with card connectors for receiving an IC card which expands the memory thereof. Each card connector is equipped with an ejector mechanism for ejecting an inserted IC card. The ejector mechanism commonly includes a push button attached to a push bar, an actuator, and an ejection plate whereby when the push button is activated by a user, the inserted card will be ejected.

Taiwan Patent Nos. 82102557, 829109139, and 83107162 and U.S. Pat. No. 5,324,204 disclose card connectors having push buttons which protrude from an outer surface of a computer housing when a card is inserted therein. The extended length of the push button and a push bar of such a design occupies too much space within the computer which is out of line with the trend of the portable computer industry regarding conservation of space. Furthermore, the protruding push button may become easily damaged by an external force acting thereon which would render the entire card connector inoperable.

Taiwan Patent No. 85103753 and U.S. Pat. No. 5,443,395 disclose card connectors having push buttons which can be pivotably received within a housing of a computer when a card is inserted therein. This structure decreases the length of the push bar and prevents the push button from being damaged, however, the amount of space occupied by the push bar and push button is not reduced.

Hence, an improved card connector apparatus is requisite to eliminate the above mentioned defects of current card connectors.

SUMMARY OF THE INVENTION

Accordingly, an objective of the present invention is to provide an ejector mechanism for a card connector of a computer having a retractably attached push button which will not be susceptible to damage by an external force.

Another objective of the present invention is to provide an ejector mechanism for a card connector which will occupy a limited space within a computer housing.

A further objective of the present invention is to provide an ejector mechanism for a card connector which interacts with a guiding and retracting means to rotate about a central axis thereof during operation.

To fulfill the above mentioned objectives, according to one embodiment of the present invention, a card connector for engaging an inserted IC card comprises a housing, contacts, an ejector mechanism, and guiding and retracting means. The guiding and retracting means is disposed between a push button and a push arm of the ejector mechanism and includes a continuous jagged guiding channel defined on a surface of an engaging socket, a guiding core, and a spring. The guiding channel forms first and second positioning portions which provide the push button with retraction and extension capabilities so that when the push button is depressed the guiding core will slide along the guiding channel. The push button is rotatably positioned in one of the two positioning portions of the channel thereby controlling the retraction/extension of the push button into/out of an enclosure of the computer.

These and additional objectives, features, and advantages of the present invention will become apparent after reading the following detailed description of the preferred embodiments of the invention taken in conjunction with the appended drawing figures.

BRIEF DESCRIPTION OF THE DRAWINGS

FIG. 3A is a schematic view of the card connector of FIG. 1A showing the push button in a protruding position;

FIG. 3B is similar to FIG. 3A showing the push button in a retracted position;

FIGS. 5A–5D are schematic views of the guiding and retracting means showing steps of engagement with the push button whereby the push button reaches the retracted position.

DETAILED DESCRIPTION OF THE PREFERRED EMBODIMENT

Reference will now be made in detail to the preferred embodiment of the present invention.

Figure 1A:
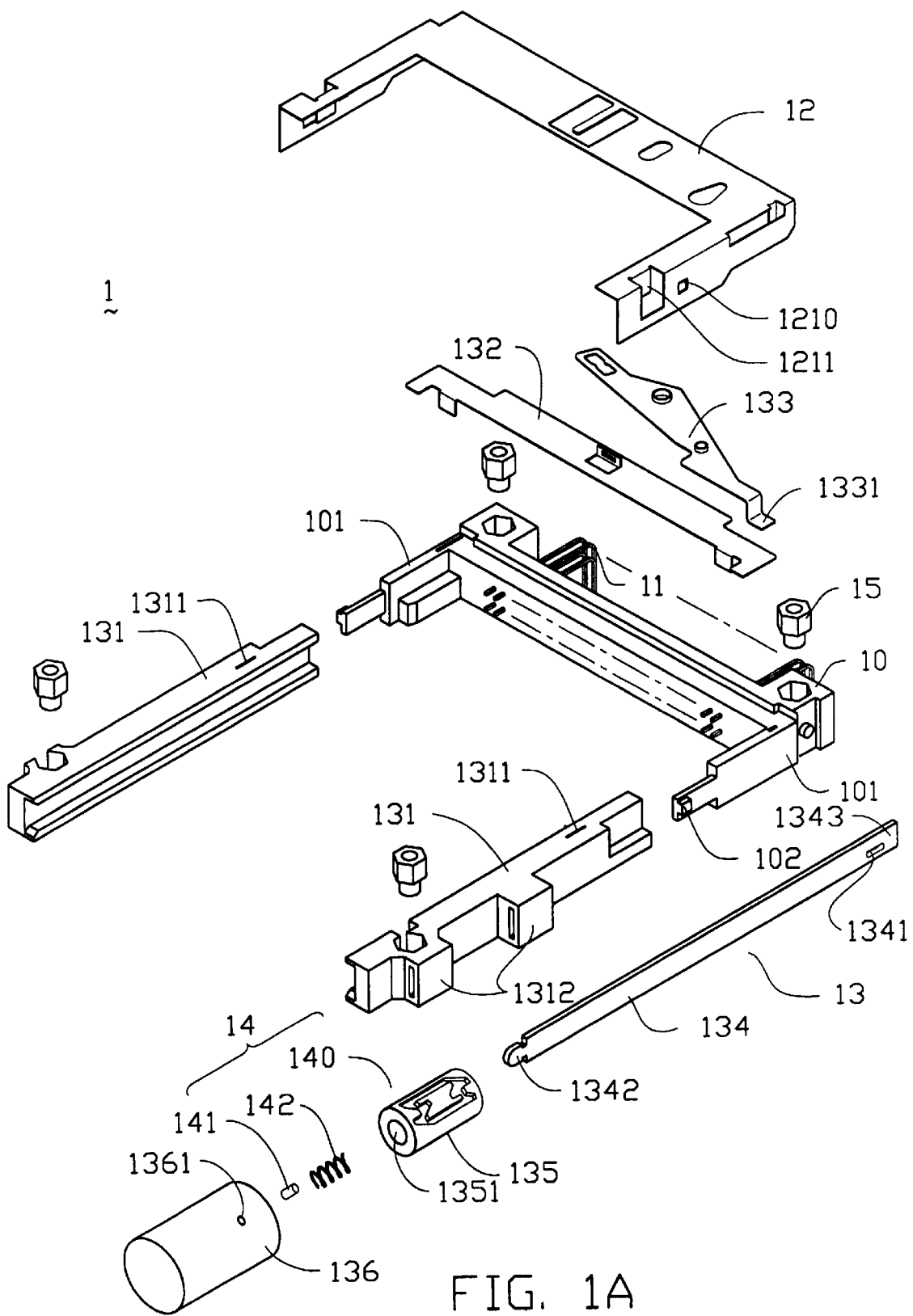
FIG. 1A is an exploded view of a card connector in accordance with a preferred embodiment of the present invention.

Referring to FIG. 1A a card connector 1 in accordance with the present invention includes a generally U-shaped housing 10 interferentially receiving a number of contacts 11. Two mounting arms 101 extending from each lateral end of the housing 10 each form a key 102 for fittingly engaging with a square hole 1210 defined in an electromagnetic shielding shell 12 which has two mounting tabs 1211 for interferentially fitting with two slits 1311 defined in two guiding arms 131 to fixedly connect the guiding arms 131 and the shielding shell 12 together. Four screws 15 are used to connect the card connector 1 to a stacked connector (not shown) or a mother board (not shown).

An ejector mechanism 13 includes the two guiding arms 131 each forming a pair of mounting ears 1312 on an outer portion thereof, an ejection plate 132, an actuator 133 forming a receiving tongue 1331 at an end thereof, a push bar 134 having a front end 1342 with a semi-circular configuration and a rear end 1343 defining a slot 1341, an engaging socket 135, and a push button 136.

Figure 1B:
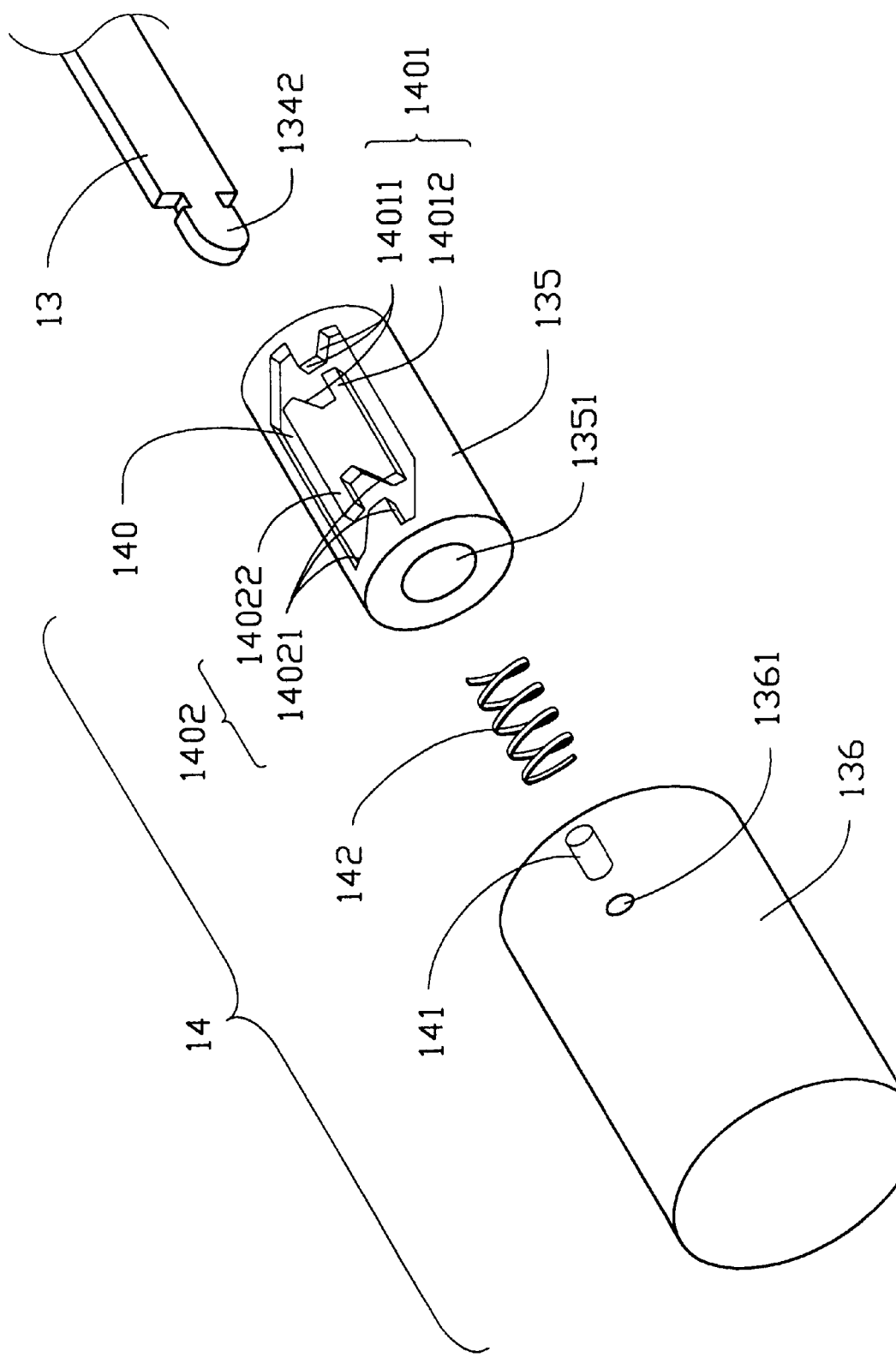
FIG. 1B is a magnified view of guiding and retracting means FIG. 1A.
Figure 1C:
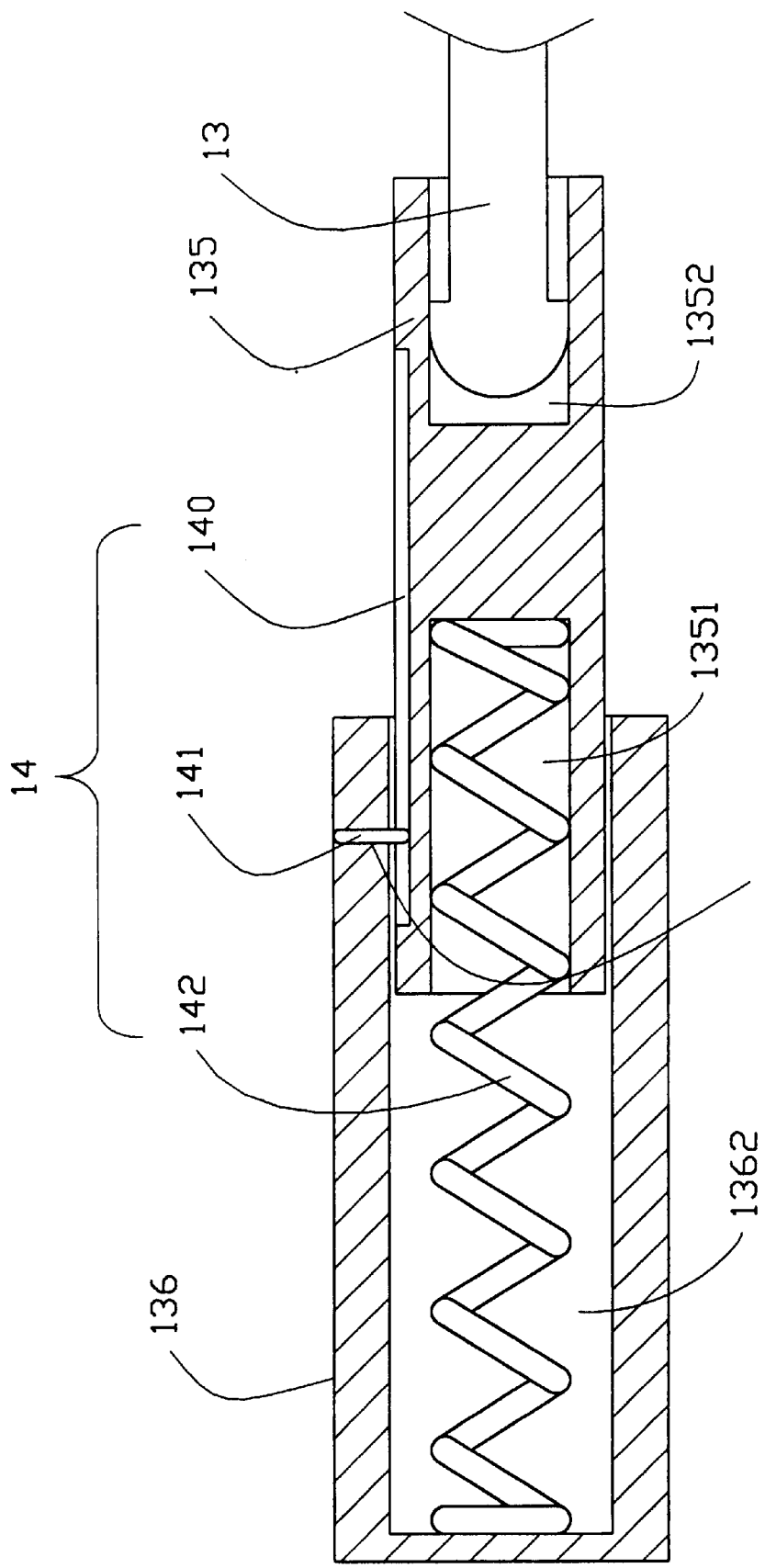
FIG. 1C is a cross sectional view of the assembled guiding retracting means of FIG. 1B.

Referring also to FIGS. 1B and 1C, guiding and retracting means 14 comprises a continuous jagged guiding channel 140 defined on a surface of the engaging socket 135, a guiding core 141, and a spring 142. The engaging socket 135 further defines a front opening 1351 and a rear opening 1352 therein. The push button 136 defines a cavity 1362 therein and a hole 1361 between an outer surface (not labeled) thereof and the cavity 1362. The guiding channel 140 of the guiding and retracting means 14 consists of a first positioning portion 1401 and a second positioning portion 1402 each consisting of three guiding slant faces 14011, 14021 and a stop portion 14012, 14022.

Figure 2:
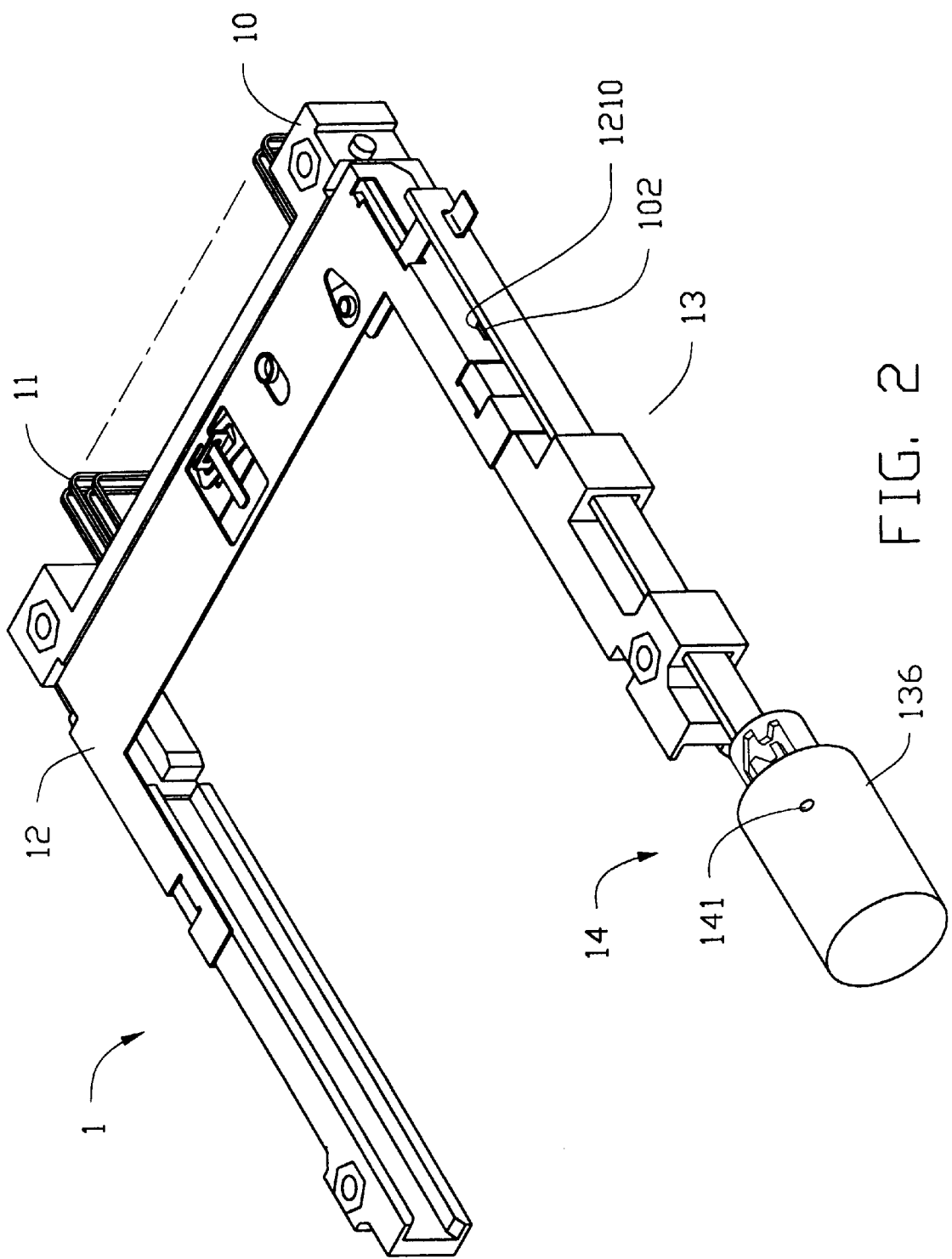
FIG. 2 is an assembled view of FIG. 1.

To assemble the guiding and retracting means 14, the guiding core 141 is pivotably connected to the hole 1361 of the push button 136. One end of the spring 142 is received in the cavity 1362 of the push button 136 and the other end of the spring 142 is fittingly received in the front opening 1351 of the engaging socket 135. The engaging socket 135 is inserted into the cavity 1362 of the push button 136 whereby the guiding core 141 is slidably received in the guiding channel 140. The front end 1342 of the push bar 134 is fixedly fitted in the rear opening 1352 of the engaging socket 135. The rear end 1343 of the push bar 134 is extended through the mounting ears 1312 of the guiding rails 131 to reach a position in which the tongue 1331 of the actuator 133 fittingly extends into the slot 1341 of the push bar 134, as shown in FIG. 2.

As shown in FIG. 3A, after the push button 136 is activated by a user to eject an IC card (not shown) and the IC card is removed from the card connector 1, the guiding core 141 will be in the second positioning portion 1402 between the stop portion 14022 and one of the guiding slant faces 14021 whereby the push button 136 protrudes from an outer surface of an enclosure 7 of the computer. The push button 136 can be depressed so that the guiding core 141 will move to the first positioning portion 1401 between the stop portion 14012 and one of the guiding slant faces 14011 whereby the push button 136 is retractably received within the enclosure 7 of the computer even though an IC card is not received in the card connector 1, as shown in FIG. 3B.

Figures 4A, 4B, 4C, 4D:
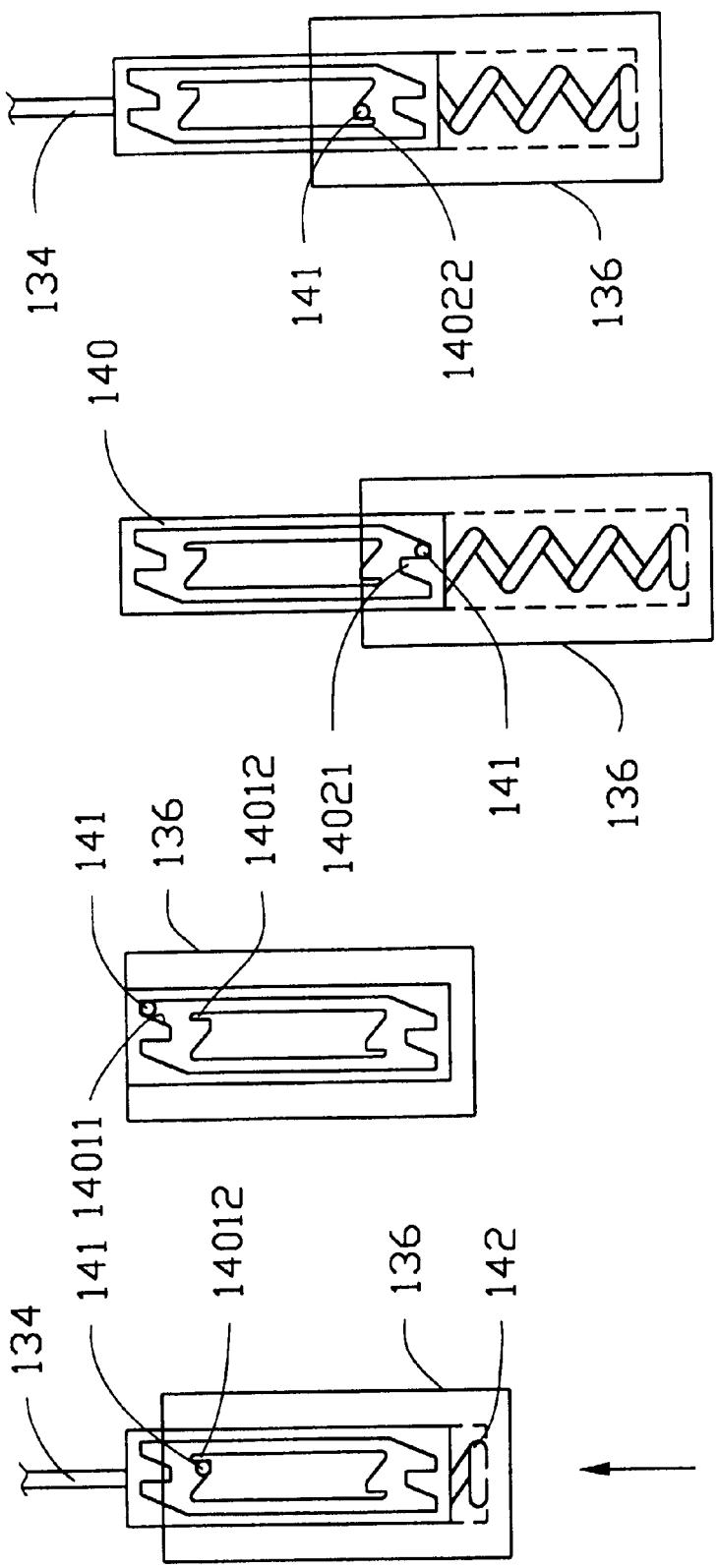
FIGS. 4A–4D are schematic views of the guiding and retracting means showing steps of engagement with the push button whereby the push button reaches the protruding position.

Referring to FIG. 4A, when an IC card is received in the card connector 1, the guiding core 141 is positioned between the stop portion 14012 and one of the guiding slant faces 14011 of the first positioning portion 1401, the push button 136 is in a retracted position, and the spring 142 is compressed. When a force is exerted on the push button 136 in a direction indicated by an arrow, the guiding core 141 will disengage from the stop portion 14012 and slide along one of the guiding slant faces 14011 to reach a position as shown in FIG. 4B. The force from the expansion of the spring 142 will cause the guiding core 141 to slide along the guiding channel 140 to reach one of the guiding slant faces 14021 of the second positioning portion 1402 whereby the push button 136 protrudes from an outer surface of the computer enclosure to facilitate operation thereof by a user, as shown in FIGS. 4C and 5A. To eject the IC card, the user exerts a force on the push button 136 which causes the guiding core 141 to abut against the stop portion 14022 of the second positioning portion 1402. The push bar 134 then moves forward to activate the ejector mechanism 13 as shown in FIGS. 4D and 5B.

After the IC card is ejected and the force exerted on the push button 136 is released, the guiding core 141 will slide along the guiding channel 140 to the position as shown in FIG. 5C. At this position, the card connector 1 can receive another IC card. When the push button 136 is depressed as far as possible and then released, the guiding core 141 will be secured by the stop portion 14012 of the first positioning portion 1401 whereby the push button 136 is in the retracted position. The connector apparatus 1 is also capable of receiving an IC card at this position and the ejection thereof would follow as previously described.

Due to the engaging arrangement of the hole 1361 of the push button 136, the guiding core 141, and the guiding channel 140, the push button 136 will rotate about a central axis thereof as the guiding core 141 moves from position to position along the guiding channel 140 thereby facilitating operation of the guiding and retracting means 14.

While the present invention has been described with reference to a specific embodiment, the description is illustrative of the invention and is not to be construed as limiting the invention. Various modifications to the present invention can be made to the preferred embodiment by those skilled in the art without departing from the true spirit and scope of the invention as defined by the appended claims.

I claim:

1. Guiding and retracting means in an ejector mechanism of a card connector wherein said ejector mechanism has a push bar for manipulating an ejection plate and a push button for effectuating a movement of the push bar;

said guiding and retracting means comprising:

an engaging socket fixedly engaged with the push bar and slidably mounted to the push button, the engaging socket having a continuous jagged guiding channel defined in an outer surface thereof, the guiding channel comprising a first positioning portion and a second positioning portion at opposite ends thereof;

a guiding core having one end attached to the push button and another end movable with the push button between the first positioning portion of the guiding channel where the push button is in a retracted position and the second positioning portion of the guiding channel where the push button is in an extended position; and a spring having one end received in the push button and another end received in the engaging socket, the spring biasing the push button to enable the guiding core to be releasably retained in one of the first and the second positioning portions of the guiding channel.

2. The guiding and retracting means as described in claim 1, wherein the first positioning portion and the second positioning portion each comprises at least one guiding slant face and a stop portion for guiding the guiding core along the guiding channel when a force is exerted on the push button.

3. The guiding and retracting means as described in claim 1, wherein the push button defines a cavity in an end thereof and said one end of the spring is received in the cavity.

4. The guiding and retracting means as described in claim 3, wherein the push button defines a hole in an outer surface thereof in communication with the cavity, and wherein said one end of the guiding core is received in the hole.

5. The guiding and retracting means as described in claim 3, wherein the engaging socket defines a front opening and a rear opening therein, and wherein said another end of the spring is fittingly received in the front opening of the engaging socket and a front end of the push bar is fixedly fitted in the rear opening of the engaging socket.

6. A card connector apparatus for a computer, comprising:

a housing receiving a plurality of contacts for engaging with an IC card;

a card guiding frame fixed to the housing for guiding the IC card into the apparatus;

an actuator pivotably mounted to the housing for ejecting an inserted IC card;

a push bar having a front end and a rear end, the rear end being connected with the actuator;

a push button; and guiding and retracting means comprising:

an engaging socket fixedly engaged with the front end of the push bar and slidably mounted to the push button, the engaging socket having a continuous jagged guiding channel defined in an outer surface thereof, the guiding channel comprising a first positioning portion and a second positioning portion at opposite ends thereof;

a guiding core having one end attached to the push button and another end movable with the push button between the first positioning portion of the guiding channel where the push button is in a retracted position and the second positioning portion of the guiding channel where the push button is in an extended position; and a spring having one end received in the push button and another end received in the engaging socket, the spring biasing the push button to enable the guiding core to be releasably retained in one of the first and the second positioning portions of the guiding channel;

whereby the push button is provided with a retracting function for being received within a housing of the computer even when an IC card is not inserted into the card connector thereby reducing occupied space of the card connector.

7. The guiding and retracting means as described in claim 6, wherein the first positioning portion and the second positioning portion each comprises at least one guiding slant face and a stop portion for guiding the guiding core along the guiding channel when a force is exerted on the push button.

8. The card connector as described in claim 6, wherein the push button defines a cavity in an end thereof and said one end of the spring is received in the cavity.

9. The card connector as described in claim 8, wherein the push button defines a hole in an outer surface thereof in communication with the cavity, and wherein said one end of the guiding core is received in the hole.

10. The card connector as described in claim 8, wherein the engaging socket defines a front opening and a rear opening therein, and wherein said another end of the spring is fittingly received in the front opening of the engaging socket and said front end of the push bar is fixedly fitted in the rear opening of the engaging socket.

11. A connector apparatus for use within a computer, comprising:

a housing;

an actuator moveable relative to the housing;

a push rod having an inner end connecting to the actuator;

an engaging socket portion positioned adjacent to an outer end of the push rod;

a push button associated with and coaxially slidably moved along the engaging socket portion; and guiding and retracting means comprising:

a guiding channel formed on end of the engaging socket portion and the push button, said guiding channel cooperating a guiding device formed on the other of the engaging socket portion and the push button thereby the push button provided with a retracted position with is generally flush with an outer surface of an enclosure of the computer and an extended position which protrudes out of the outer surface of the enclosure of the computer with a significant distance for easy operation of the guiding and retracting means.

12. The connector apparatus as described in claim 11, wherein the engaging socket portion does not substantially protrude out of the outer surface of the enclosure of the computer.

* * * * *